United States Patent
Bowen et al.

(10) Patent No.: US 6,677,226 B1
(45) Date of Patent: Jan. 13, 2004

(54) METHOD FOR FORMING AN INTEGRATED CIRCUIT HAVING A BONDING PAD AND A FUSE

(75) Inventors: Carl L. Bowen, Richmond, VA (US); Keith Q. Lao, Glenn Allen, VA (US)

(73) Assignee: Motorola, Inc., Schaumburg, IL (US)

( * ) Notice: Subject to any disclaimer, the term of this patent is extended or adjusted under 35 U.S.C. 154(b) by 812 days.

(21) Appl. No.: 09/075,767

(22) Filed: May 11, 1998

(51) Int. Cl.[7] .............................................. H01L 21/44
(52) U.S. Cl. ...................................................... 438/601
(58) Field of Search ................................ 438/601, 622, 438/636, 637, 666, 624, 634, 132, 281, 710; 257/529, 209

(56) References Cited

U.S. PATENT DOCUMENTS

| | | | |
|---|---|---|---|
| 4,413,272 A | 11/1983 | Mochizuki et al. ............ 357/65 |
| 4,628,590 A | 12/1986 | Udo et al. ..................... 29/575 |
| 4,984,054 A * | 1/1991 | Yamada et al. ............... 357/51 |
| 5,021,663 A * | 6/1991 | Hornbeck ................... 250/349 |
| 5,057,186 A * | 10/1991 | Chew et al. .................. 165/643 |
| 5,096,850 A | 3/1992 | Lippitt, III ................... 437/173 |
| 5,122,225 A * | 6/1992 | Douglas ....................... 156/643 |
| 5,235,205 A | 8/1993 | Lippitt, III ................... 257/528 |
| 5,419,805 A * | 5/1995 | Jolly ........................ 156/643.1 |
| 5,444,012 A * | 8/1995 | Yoshizumi et al. ......... 438/601 |
| 5,844,295 A * | 12/1998 | Tsukude et al. ............. 257/529 |

* cited by examiner

Primary Examiner—W. David Coleman
(74) Attorney, Agent, or Firm—Kent J. Cooper

(57) ABSTRACT

In one embodiment, a first dielectric layer (32) that overlies a fuse (16) and a bonding pad (30) is etched with a first etch process. This first etch process exposes a portion (40) of a second dielectric layer (20) that underlies the first dielectric layer (32) and overlies the fuse (16). In addition, the first etch process also forms a bond pad opening (38) that exposes a portion (42) of an anti-reflective layer (28) that forms a portion of the bonding pad (30). A second etch process is then used to etch the exposed portion (42) of the anti-reflective layer (28) and the exposed portion (40) of the second dielectric layer (20) at substantially the same rate to form a fuse window (45) overlying the fuse (16). The second etch process prevents over etching of the second dielectric layer (20), and thus exposure of the underlying fuse (16).

44 Claims, 2 Drawing Sheets

METHOD FOR FORMING AN INTEGRATED CIRCUIT HAVING A BONDING PAD AND A FUSE

FIELD OF THE INVENTION

This invention relates generally to integrated circuits, and more specifically to a method for forming fuse windows and bond pad openings in an integrated circuit.

BACKGROUND OF THE INVENTION

The semiconductor industries continuing drive toward integrated circuits with ever decreasing geometries coupled with its pervasive use of highly reflective interconnect materials such as polysilicon, aluminum, refractory metals and metal silicides has led to increased photolithography patterning problems. Unwanted reflections from these underlying interconnect materials during the photoresist patterning process cause the interconnect photoresist pattern and the resulting interconnect to be distorted. This problem is further compounded when photolithographic imaging tools having ultraviolet and deep ultraviolet exposure wavelengths are used to generate the photoresist patterns.

One technique proposed to minimize reflections from an underlying reflective interconnect material is to form an anti-reflective coating over it prior to photoresist patterning. However, integration of the anti-reflective coating into the fabrication process has been problematic. For example, it has been found that bond pads formed using a titanium nitride anti-reflective coating have poor adhesion to subsequently formed wire bonds. Therefore, the titanium nitride anti-reflective coating must be removed prior to forming the wire bond to the bonding pad. Removal of this titanium nitride anti-reflective coating, however, adversely affects the formation of fuse windows on other portions of the integrated circuit. More specifically, if fuse windows and bonding pad openings are formed at the same time, then the fuse window is over etched and the underlying fuse is exposed because the titanium nitride anti-reflective coating etches at a much slower rate than does the dielectric layer overlying the fuse. Exposure of the fuse adversely effects the reliability of the integrated circuit because the fuse may corrode if it is exposed, especially if the integrated circuit uses aluminum fuses.

Accordingly a need exists for a method that reliably allows fuse windows and bond pad openings to be formed within integrated circuits.

DETAILED DESCRIPTION OF THE DRAWINGS

Figure 1:
FIGS. 1–7 illustrate, in cross-section, process steps in accordance with one embodiment of the invention.

FIGS. 1–7 illustrate, in cross section, process steps for forming an integrated circuit in accordance with one embodiment of the present invention. Shown in FIG. 1 is a portion 10 of an integrated circuit structure comprising a semiconductor substrate 12, a dielectric layer 14, a fuse 16, and a conductive interconnect 18. In one embodiment, semiconductor substrate 12 is a monocrystalline silicon substrate. Alternatively, semiconductor substrate 12 may be a silicon-on-insulator substrate, a silicon-on-sapphire substrate, or the like.

In one embodiment, dielectric layer 14 is a layer of plasma deposited oxide which is formed using TEOS as a source gas. Alternatively, dielectric layer 14 may be a layer of silicon nitride, a layer of PSG, a layer of BPSG, an SOG layer, a silicon oxynitride layer, a polyimide layer, a low dielectric constant insulator, or a combination thereof. Dielectric layer 14 may be deposited using conventional plasma deposition techniques, chemical vapor deposition techniques, spin on coating techniques, or a combination thereof.

In one embodiment, fuse 16 and conductive interconnect 18 are formed by depositing a conductive layer comprising aluminum, such as a layer of aluminum (Al), aluminum-silicon (AlSi), aluminum-copper (AlCu), aluminum-copper-silicon (AlCuSi), or the like, onto dielectric layer 14. The conductive layer is then patterned to form fuse 16 and conductive interconnect 18. Alternatively, fuse 16 and conductive interconnect 18 may be formed using other conductive layers, such as a layer of polysilicon, polycide, copper, or the like. In addition, it should be appreciated that fuse 16 and conductive interconnect 18 can also be formed using dissimilar materials. For example, fuse 16 may be formed using a conductive layer comprising aluminum and conductive interconnect 18 may be formed using a conductive layer of copper, in which case two separate deposition and patterning steps would be used to form fuse 16 and conductive interconnect 18. Fuse 16 and conductive interconnect 18 may be forming using conventional deposition techniques, such as sputtering, chemical vapor deposition, plating, or a combination thereof, and conventional patterning techniques, such as plasma etching, chemical mechanical polishing, or a combination thereof.

It should be appreciated that conductive interconnect 18 and fuse 16 are electrically connected to semiconductor devices (not shown) that are formed on semiconductor substrate 12.

Figure 2:
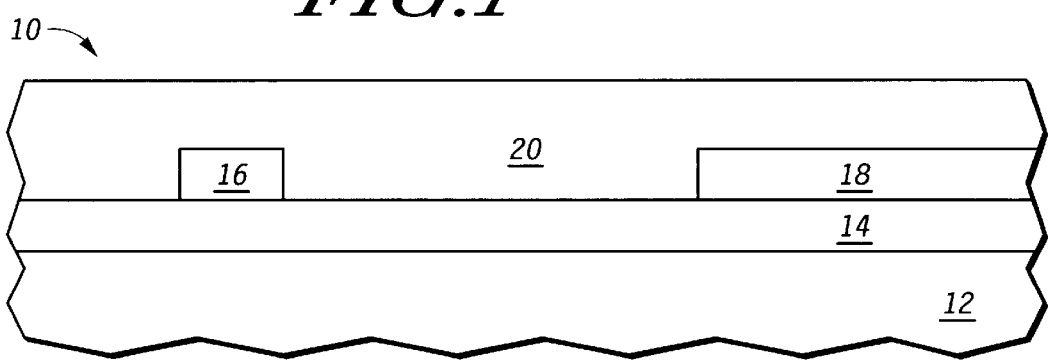

In FIG. 2 a dielectric layer 20 is then formed overlying fuse 16 and conductive interconnect 18. In one embodiment, dielectric layer 20 is a layer of plasma deposited oxide which is formed using TEOS as a source gas. Alternatively, dielectric layer 20 may be a layer of silicon nitride, a layer of PSG, a layer of BPSG, an SOG layer, a silicon oxynitride layer, a polyimide layer, a low dielectric constant insulator, or a combination thereof. Dielectric layer 20 may be deposited using conventional plasma deposition techniques, chemical vapor deposition techniques, spin on coating techniques, or a combination thereof. After being deposited, dielectric layer 20 may be planarized using conventional techniques, such a plasma etching, chemical mechanical polishing, or a combination thereof.

Figure 3:
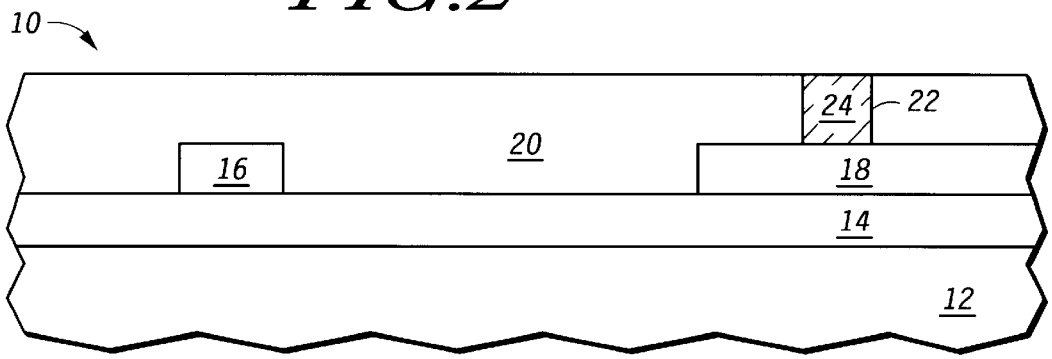

In FIG. 3 an opening 22 is then formed within a portion of dielectric layer 20 to expose a portion of conductive interconnect 18. A conductive plug 24 is then formed within opening 22 as shown in FIG. 3. Conductive plug 24 may be formed using conventional techniques. For example, conductive plug 24 may be formed by depositing a conductive layer comprising titanium, such as a layer titanium, titanium nitride, or a combination thereof, within opening 22 and then forming a layer of tungsten overlying the conductive layer comprising titanium. Portions of the tungsten layer and the conductive layer comprising titanium are then removed to form conductive plug 24. It should be appreciated that chemical mechanical polishing, plasma etching, or a combination thereof, may be used to form conductive plug 24.

Figure 4:
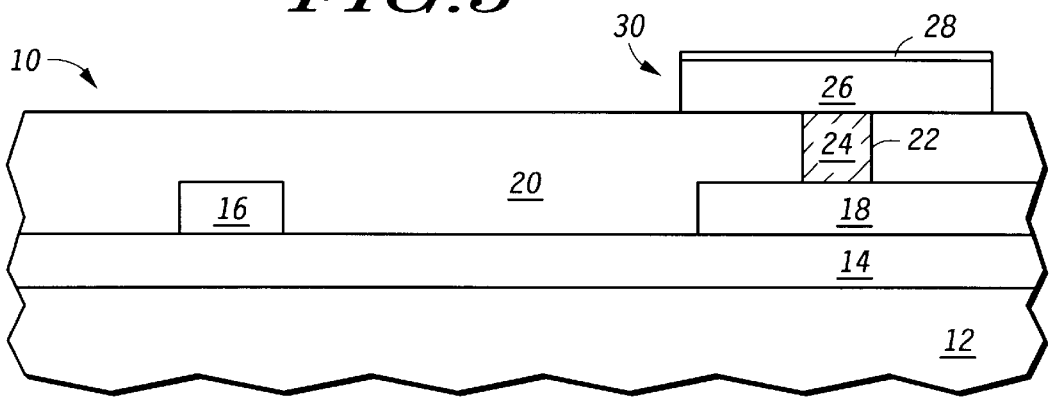

In FIG. 4 a bonding pad 30 is then formed overlying dielectric layer 20. Bonding pad 30 comprises an anti-reflective layer 28 that overlies a conductive layer 26. In one embodiment, bonding pad 30 is formed by depositing a conductive layer comprising aluminum, such as a layer of aluminum (Al), aluminum-silicon (AlSi), aluminum-copper (AlCu), aluminum-copper-silicon (AlCuSi), or the like, onto dielectric layer 14, and then depositing an anti-reflective layer comprising titanium, such as a layer of titanium nitride, titanium-tungsten, or the like, onto the conductive layer comprising aluminum. The anti-reflective layer comprising titanium and the conductive layer comprising aluminum are then patterned to form bonding pad 30. Alternatively, bonding pad 30 may be formed using other conductive layers, such as a layer of copper, and other anti-reflective layers, such a layer of silicon nitride, silicon oxynitride, or the like. Bonding pad 30 may be forming using conventional deposition techniques, such as sputtering, chemical vapor deposition, plating, or a combination thereof, and conventional patterning techniques, such as plasma etching, chemical mechanical polishing, or a combination thereof. As shown in FIG. 4, bonding pad 30 is electrically shorted to conductive interconnect 18 by way of conductive plug 24. It should be appreciated, however, that bonding pad 30 may also be formed such that bonding pad 30 directly contacts conductive interconnect 18 through opening 22. In this case, conductive plug 24 would not be formed within opening 22.

Figure 5:
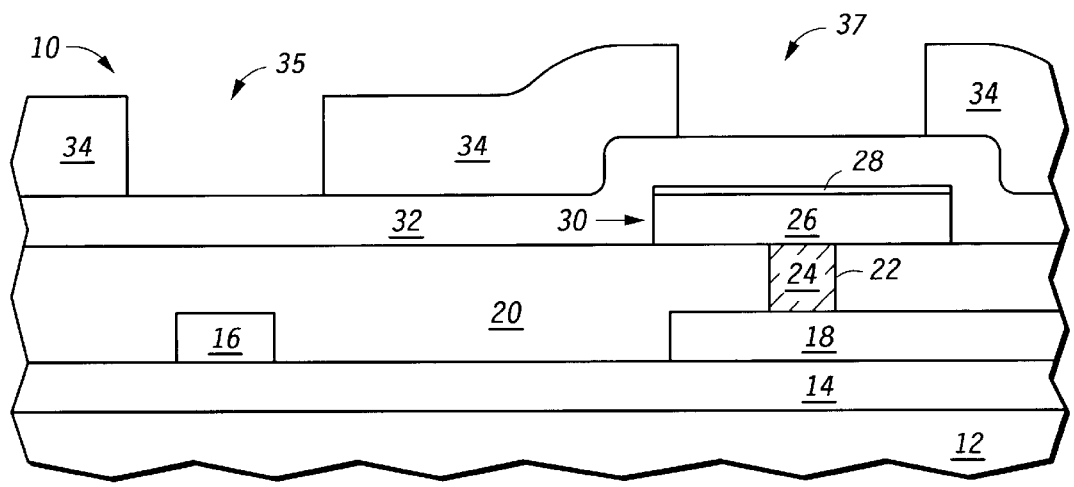

In FIG. 5 a dielectric layer 32 is then formed overlying fuse 16 and bonding pad 30. In one embodiment dielectric layer 32 is a composite layer comprising a layer of silicon nitride overlying a layer of phosphorus doped silicon dioxide. Alternatively, dielectric layer 32 may be a composite layer comprising a layer of silicon oxynitride overlying a layer of phosphorus doped silicon dioxide, a layer of phosphorus doped silicon dioxide, silicon nitride, silicon oxynitride, or the like.

A patterned polyimide layer 34 is then formed overlying dielectric layer 32. As shown in FIG. 5 patterned polyimide layer 34 has an opening 35 that overlies fuse 16 and an opening 37 that overlies bonding pad 30. In one embodiment, patterned polyimide layer 34 is photo-imagible, and thus is patterned using conventional exposure and developing techniques. Alternatively, patterned polyimide layer 34 may be formed using non-photo-imagible polyimide, in which case it would be patterned using conventional etching techniques, such as wet etching, plasma etching, or a combination thereof.

Figure 6:
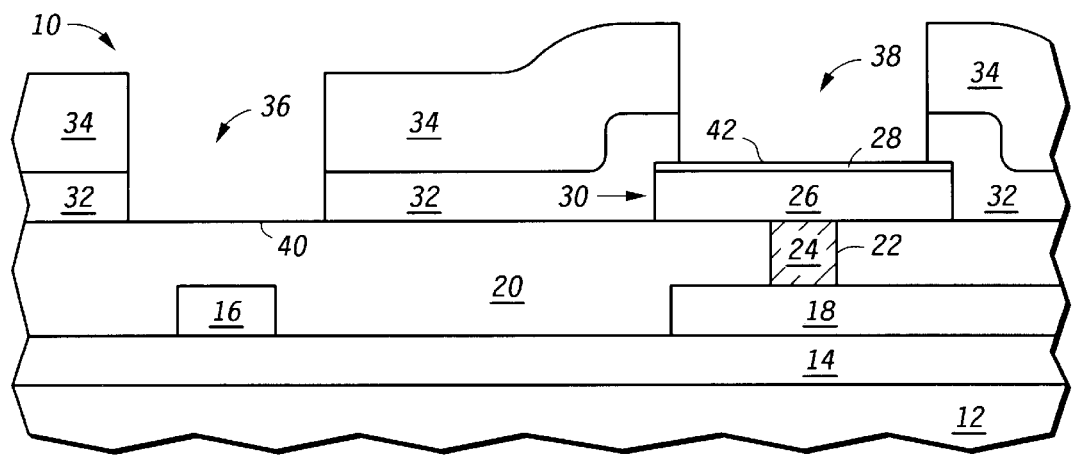

In FIG. 6 patterned polyimide layer 34 is used as an etch mask and dielectric layer 32 is etched to form an opening 36 overlying fuse 16 and a bond pad opening 38 overlying bonding pad 30. As shown in FIG. 6, with this etch process a portion 40 of dielectric layer 20 is exposed within opening 36 and a portion 42 of anti-reflective layer 28 is exposed within bond pad opening 38. More specifically, within bond pad opening 38 dielectric layer 32 is etched selectively to anti-reflective layer 28 with this etch process, and thus conductive layer 26 is not exposed by this etch process. In one embodiment, dielectric layer 32 is etched selectively to anti-reflective layer 28 in an Applied Materials Centura magnetically enhanced reactive ion etch (MERIE) system having an MXP etch chamber. In a particular embodiment wherein anti-reflective layer 28 comprises a layer of titanium nitride and dielectric layer 32 comprises a layer of silicon nitride overlying a layer of phosphorus doped silicon dioxide, selectivity to the titanium nitride is approximately 10:1 (i.e. dielectric layer 32 etches approximately 10 times faster than anti-reflective layer 28) in the Applied etch system under the following conditions; a carbon tetrafluoride ($CF_4$) flow rate of approximately 100 sccm, a chamber pressure of approximately 200 millitorr, an RF power of approximately 950 watts, and a backside helium pressure of approximately 8 torr.

Figure 7:
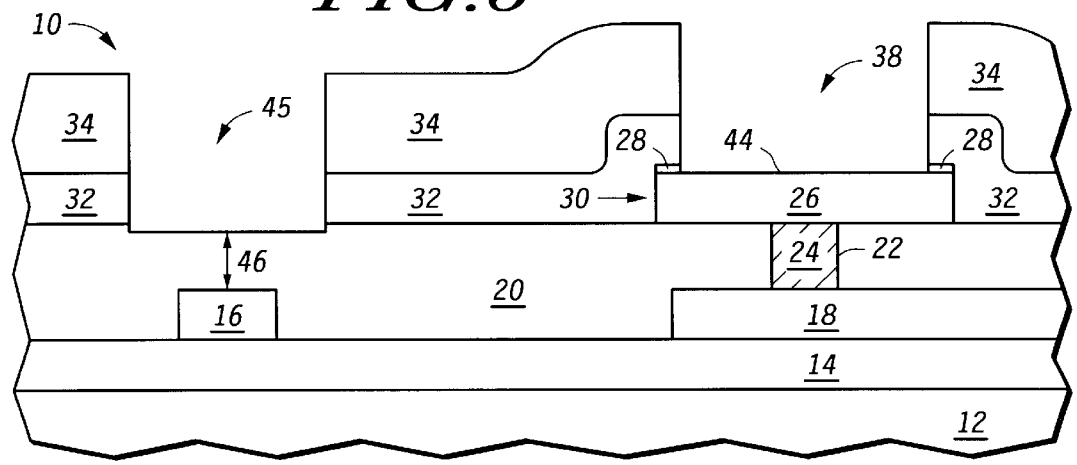

In FIG. 7 exposed portion 42 of anti-reflective layer 28 and exposed portion 40 of dielectric layer 20 are etched to expose a portion 44 of conductive layer 26 and to form a fuse window 45 overlying fuse 16. As shown in FIG. 7, this etch process leaves a portion 46 of dielectric layer 20 overlying fuse 16. More specifically, in this etch process exposed portion 42 and exposed portion 40 are etched at substantially the same rate. In one embodiment, the etch rate of exposed portion 42 ranges from approximately 400 angstroms per minute to approximately 600 angstroms per minute and the etch rate of exposed portion 40 is within 20 percent of the etch rate of exposed portion 42. In a particular embodiment wherein anti-reflective layer 28 comprises a titanium nitride layer and dielectric layer 20 comprises a layer of plasma deposited oxide, the titanium nitride and the plasma deposited oxide can both be etched at a rate of approximately 500 angstroms per minute in a Gasonics downstream microwave etch system under the following conditions; a carbon tetrafluoride ($CF_4$) flow rate of approximately 200 sccm, an oxygen flow rate of approximately 1250 sccm, a chamber pressure of approximately 1750 millitorr, a power of approximately 1000 watts, wherein the power is pulsed on for approximately 5 seconds and then off for approximately 1 second during the etch process. Thus, in this particular embodiment a selectivity of approximately 1:1 is achieved between the titanium nitride and the plasma deposited oxide.

In one embodiment, the patterned polyimide layer 34 is then cured at a temperature of approximately 350° C. for approximately five hours in an ambient comprising nitrogen after exposed portion 42 and exposed portion 40 have been etched. Exposed portion 44 of conductive layer 26 is then exposed to a plasma comprising oxygen in order to remove residual fluorine from the surface of conductive layer 26, which can adversely effect the adhesion between bonding pad 30 and a subsequent wire bond formed to bonding pad 30. Light from a laser is then transmitted through remaining portion 46 of dielectric layer 20 in order to melt and blow fuse 16, in order to repair defects within the integrated circuit or to program the integrated circuit. In addition, a wire bond is formed to bonding pad 30.

It should be appreciated that the present invention allows wire bonds to be reliably formed to bonding pad 30 since portion 42 of anti-reflective layer 28 is removed prior to wire bonding. In addition, the present invention also allows fuses to be reliably formed because the etch process used to remove portion 42 leaves portion 46 of dielectric layer 20 overlying fuse 16. As a result, fuse 16 is not exposed and corrosion of fuse 16 is prevented. Furthermore, since a controlled thickness of dielectric layer 20 is left overlying fuse 16 it can be reliably blown from die to die and from wafer to wafer.

Thus it is apparent that there has been provided, in accordance with the present invention, a method for forming fuse windows and bond pad openings within an integrated circuit. Although the invention has been described and illustrated with reference to specific embodiments, it is not intended that the invention be limited to these illustrative embodiments. Those skilled in the art will recognize that modifications and variations may be made without departing from the spirit and scope of the invention. Therefore, it is intended that this invention encompass all variations and modifications as fall within the scope of the appended claims.

What is claimed is:

1. A method for forming an integrated circuit comprising the steps of:

providing a semiconductor substrate;

forming a first conductive layer overlying the semiconductor substrate;

removing a portion of the first conductive layer to define a fuse and a conductive interconnect;

forming a first dielectric layer overlying the fuse and the conductive interconnect;

forming a bonding pad overlying the first dielectric layer, wherein the bonding pad comprises an anti-reflective layer overlying a second conductive layer, and wherein the bonding pad is electrically shorted to the conductive interconnect;

forming a second dielectric layer overlying the fuse and the bonding pad;

etching the second dielectric layer using a first etch process to form an exposed portion of the first dielectric layer and to form an exposed portion of the anti-reflective layer, wherein the exposed portion of the first dielectric layer overlies the fuse, and wherein the second conductive layer is not exposed by the first etch process; and etching the exposed portion of the anti-reflective layer and the exposed portion of the first dielectric layer using a second etch process to leave a remaining portion of the first dielectric layer overlying the fuse and to expose a portion of the second conductive layer, the exposed portion of the anti-reflective layer having a first etch rate and the exposed portion of the first dielectric layer having a second etch rate, wherein the first etch rate and the second etch rate are substantially the same such that an etch selectivity of approximately 1:1 is achieved between the exposed portion of the anti-reflective layer and the exposed portion of the first dielectric layer.

2. The method of claim 1, wherein the first etch rate ranges from approximately 400 angstroms per minute to approximately 600 angstroms per minute.

3. The method of claim 1, wherein the step of etching the exposed portion of the anti-reflective layer and the exposed portion of the first dielectric layer is further characterized as etching the exposed portion of the anti-reflective layer and the exposed portion of the first dielectric layer in a downstream etch system.

4. The method of claim 1, wherein the step of etching the exposed portion of the anti-reflective layer and the exposed portion of the first dielectric layer is further characterized as etching the exposed portion of the anti-reflective layer and the exposed portion of the first dielectric layer in a plasma comprising oxygen, carbon, and fluorine.

5. The method of claim 1, wherein the step of etching the exposed portion of the anti-reflective layer and the exposed portion of the first dielectric layer is further characterized as etching the exposed portion of the anti-reflective layer and the exposed portion of the first dielectric layer using carbon tetrafluoride and oxygen.

6. The method of claim 1, wherein the step of forming the first conductive layer is further characterized as forming a conductive layer comprising aluminum.

7. The method of claim 1, wherein the anti-reflective layer is further characterized as an anti-reflective layer comprising titanium.

8. A method for forming an integrated circuit comprising the steps of:

providing a semiconductor substrate;

forming a first dielectric layer overlying the semiconductor substrate;

forming a fuse overlying the first dielectric layer, wherein the fuse comprises aluminum;

forming a second dielectric layer overlying the fuse;

forming a bonding pad overlying the second dielectric layer, wherein the bonding pad comprises a titanium nitride layer overlying a conductive layer;

forming a third dielectric layer overlying the fuse and the bonding pad;

etching the third dielectric layer to form an exposed portion of the second dielectric layer and to form an exposed portion of the titanium nitride layer, wherein the exposed portion of the second dielectric layer overlies the fuse and the conductive layer is not exposed; and etching the exposed portion of the titanium nitride layer and the exposed portion of the second dielectric layer to form an exposed portion of the conductive layer and to leave a portion of the second dielectric layer overlying the fuse, the exposed portion of the titanium nitride layer having a first etch rate and the exposed portion of the second dielectric layer having a second etch rate, wherein the first etch rate and the second etch rate are substantially the same such that an etch selectivity of approximately 1:1 is achieved between the exposed portion of the titanium nitride layer and the exposed portion of the second dielectric layer.

9. The method of claim 8, wherein the first etch rate ranges from approximately 400 angstroms per minute to approximately 600 angstroms per minute.

10. The method of claim 8, wherein the step of etching the exposed portion of the titanium nitride layer and the exposed portion of the second dielectric layer is further characterized as etching the exposed portion of the titanium nitride layer and the exposed portion of the second dielectric layer in a downstream etch system.

11. The method of claims 8, wherein the step of etching the exposed portion of the titanium nitride layer and the exposed portion of the second dielectric layer is further characterized as etching the exposed portion of the titanium nitride layer and the exposed portion of the second dielectric layer in a plasma comprising oxygen, carbon, and fluorine.

12. The method of claim 8, wherein the step of etching the exposed portion of the titanium nitride layer and the exposed portion of the second dielectric layer is further characterized as etching the exposed portion of the titanium nitride layer and the exposed portion of the second dielectric layer using oxygen and carbon tetrafluoride.

13. A method for forming an integrated circuit comprising the steps of:

providing a semiconductor substrate;

forming a fuse overlying the semiconductor substrate;

forming a first dielectric layer overlying the fuse;

forming a bonding pad overlying the first dielectric layer, wherein the bonding pad comprises an anti-reflective layer overlying a conductive layer; and etching a portion of the anti-reflective layer and a portion of the first dielectric layer to leave a remaining portion of the first dielectric layer overlying the fuse and to expose a portion of the conductive layer, the anti-reflective layer having a first etch rate and the first dielectric layer having a second etch rate, wherein the first etch rate and the second etch rate are substantially the same such that an etch selectivity of approximately 1:1 is achieved between the anti-reflective layer and the first dielectric layer.

14. The method of claim 13, wherein the first etch rate ranges from approximately 400 angstroms per minute to approximately 600 angstroms per minute.

15. The method of claim 13, wherein the step of etching the anti-reflective layer and the first dielectric layer is further characterized as etching the anti-reflective layer and the first dielectric layer in a downstream etch system.

16. The method of claim 13, wherein the step of etching the anti-reflective layer and the first dielectric layer is further characterized as etching the anti-reflective layer and the first dielectric layer in a plasma comprising oxygen, carbon, and fluorine.

17. The method of claim 13, wherein the step of etching the anti-reflective layer and the first dielectric layer is further characterized as etching the anti-reflective layer and the first dielectric layer using carbon tetrafluoride and oxygen.

18. The method of claim 13, wherein the step of forming the fuse is further characterized as forming a fuse comprising aluminum.

19. The method of claim 13, wherein the anti-reflective layer is further characterized as layer of titanium nitride.

20. A method for forming an integrated circuit comprising the steps of:
    providing a semiconductor substrate;
    forming a first conductive layer overlying the semiconductor substrate;
    removing a portion of the first conductive layer to define a fuse and a conductive interconnect;
    forming a first dielectric layer overlying the fuse and the conductive interconnect;
    forming a bonding pad overlying the first dielectric layer, wherein the bonding pad comprises an anti-reflective layer overlying a second conductive layer, and wherein the bonding pad is electrically shorted to the conductive interconnect;
    forming a second dielectric layer overlying the fuse and the bonding pad;
    etching the second dielectric layer using a first etch process to form an exposed portion of the first dielectric layer and to form an exposed portion of the anti-reflective layer, wherein the exposed portion of the first dielectric layer overlies the fuse, and wherein the second conductive layer is not exposed by the first etch process; and
    etching the exposed portion of the anti-reflective layer and the exposed portion of the first dielectric layer using a second etch process to leave a remaining portion of the first dielectric layer overlying the fuse and to expose a portion of the second conductive layer, the exposed portion of the anti-reflective layer having a first etch rate and the exposed portion of the first dielectric layer having a second etch rate, wherein the second etch rate is within 20 percent of the first etch rate such that an etch selectivity of approximately 1:1 is achieved between the exposed portion of the anti-reflective layer and the exposed portion of the first dielectric layer.

21. The method of claim 20, wherein the first etch rate ranges from approximately 400 angstroms per minute to approximately 600 angstroms per minute.

22. The method of claim 20, wherein the step of etching the exposed portion of the anti-reflective layer and the exposed portion of the first dielectric layer is further characterized as etching the exposed portion of the anti-reflective layer and the exposed portion of the first dielectric layer in a downstream etch system.

23. The method of claim 20, wherein the step of etching the exposed portion of the anti-reflective layer and the exposed portion of the first dielectric layer is further characterized as etching the exposed portion of the anti-reflective layer and the exposed portion of the first dielectric layer in a plasma comprising oxygen, carbon, and fluorine.

24. The method of claim 20, wherein the step of etching the exposed portion of the anti-reflective layer and the exposed portion of the first dielectric layer is further characterized as etching the exposed portion of the anti-reflective layer and the exposed portion of the first dielectric layer using carbon tetrafluoride and oxygen.

25. The method of claim 20, wherein the step of forming the first conductive layer is further characterized as forming a conductive layer comprising aluminum.

26. The method of claim 20, wherein the anti-reflective layer is further characterized as an anti-reflective layer comprising titanium.

27. A method for forming an integrated circuit comprising the steps of:
    providing a semiconductor substrate;
    forming a first dielectric layer overlying the semiconductor substrate;
    forming a fuse overlying the first dielectric layer, wherein the fuse comprises aluminum;
    forming a second dielectric layer overlying the fuse;
    forming a bonding pad overlying the second dielectric layer, wherein the bonding pad comprises a titanium nitride layer overlying a conductive layer;
    forming a third dielectric layer overlying the fuse and the bonding pad;
    etching the third dielectric layer to form an exposed portion of the second dielectric layer and to form an exposed portion of the titanium nitride layer, wherein the exposed portion of the second dielectric layer overlies the fuse and the conductive layer is not exposed; and
    etching the exposed portion of the titanium nitride layer and the exposed portion of the second dielectric layer to form an exposed portion of the conductive layer and to leave a portion of the second dielectric layer overlying the fuse, the exposed portion of the titanium nitride layer having a first etch rate and the exposed portion of the second dielectric layer having a second etch rate, wherein the second etch rate is within 20 percent of the first etch rate such that an etch selectivity of approximately 1:1 is achieved between the exposed portion of the titanium nitride layer and the exposed portion of the second dielectric layer.

28. The method of claim 27, wherein the first etch rate ranges from approximately 400 angstroms per minute to approximately 600 angstroms per minute.

29. The method of claim 27, wherein the step of etching the exposed portion of the titanium nitride layer and the exposed portion of the second dielectric layer is further characterized as etching the exposed portion of the titanium nitride layer and the exposed portion of the second dielectric layer in a downstream etch system.

30. The method of claim 27, wherein the step of etching the exposed portion of the titanium nitride layer and the exposed portion of the second dielectric layer is further characterized as etching the exposed portion of the titanium nitride layer and the exposed portion of the second dielectric layer in a plasma comprising oxygen, carbon, and fluorine.

31. The method of claim 27, wherein the step of etching the exposed portion of the titanium nitride layer and the exposed portion of the second dielectric layer is further characterized as etching the exposed portion of the titanium nitride layer and the exposed portion of the second dielectric layer using oxygen and carbon tetrafluoride.

32. A method for forming an integrated circuit comprising the steps of:

provided a semiconductor substrate;

forming a fuse overlying the semiconductor substrate;

forming a first dielectric layer overlying the fuse;

forming a bonding pad overlying the first dielectric layer, wherein the bonding pad comprises an anti-reflective layer overlying a conductive layer; and etching a portion of the anti-reflective layer and a portion of the first dielectric layer to leave a remaining portion of the first dielectric layer overlying the fuse and to expose a portion of the conductive layer, the anti-reflective layer having a first etch rate and the first dielectric layer having a second etch rate, wherein the second etch rate is within 20 percent of the first etch rate such that an etch selectivity of approximately 1:1 is achieved between the anti-reflective layer and the first dielectric layer.

33. The method of claim 32, wherein the first etch rate ranges from approximately 400 angstroms per minute to approximately 600 angstroms per minute.

34. The method of claim 32, wherein the step of etching the anti-reflective layer and the first dielectric layer is further characterized as etching the anti-reflective layer and the first dielectric layer in a downstream etch system.

35. The method of claim 32, wherein the step of etching the anti-reflective layer and the first dielectric layer is further characterized as etching the anti-reflective layer and the first dielectric layer in a plasma comprising oxygen, carbon, and fluorine.

36. The method of claim 32, wherein the step of etching the anti-reflective layer and the first dielectric layer is further characterized as etching the anti-reflective layer and the first dielectric layer using carbon tetrafluoride and oxygen.

37. The method of claim 32, wherein the step of forming the fuse is further characterized as forming a fuse comprising aluminum.

38. The method of claim 32, wherein the anti-reflective layer is further characterized as layer of titanium nitride.

39. The method of claim 32, further comprising forming a second dielectric layer before etching the portion of the anti-reflective layer, wherein the second dielectric layer includes nitrogen.

40. The method of claim 1, wherein:

the second dielectric layer includes nitrogen; and the second dielectric layer is formed before etching the exposed portion of the anti-reflective layer.

41. The method of claim 8, wherein:

the third dielectric layer includes nitrogen; and the third dielectric layer is formed before etching the exposed portion of the titanium nitride layer.

42. The method of claim 13, further comprising forming a second dielectric layer before etching the portion of the anti-reflective layer, wherein the second dielectric layer includes nitrogen.

43. The method of claim 20, wherein:

the second dielectric layer includes nitrogen; and the second dielectric layer is formed before etching the exposed portion of the anti-reflective layer.

44. The method of claim 27, wherein:

the third dielectric layer includes nitrogen; and the third dielectric layer is formed before etching the exposed portion of the titanium nitride layer.

* * * * *